(12) United States Patent
Jobetto

(10) Patent No.: US 7,790,515 B2
(45) Date of Patent: Sep. 7, 2010

(54) SEMICONDUCTOR DEVICE WITH NO BASE MEMBER AND METHOD OF MANUFACTURING THE SAME

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 174 days.

(21) Appl. No.: 11/986,698

(22) Filed: Nov. 26, 2007

(65) Prior Publication Data

US 2008/0122087 A1 May 29, 2008

(30) Foreign Application Priority Data

Nov. 28, 2006 (JP) ............................. 2006-319910

(51) Int. Cl.
*H01L 21/00* (2006.01)
(52) U.S. Cl. ................ 438/127; 438/640; 257/E23.169
(58) Field of Classification Search ................ 257/738, 257/E23.169; 438/127, 622, 629, 640; *H01L 21/56, H01L 21/60, 23/31, 23/485, 23/538*
See application file for complete search history.

(56) References Cited

U.S. PATENT DOCUMENTS

| 7,198,996 | B2 * | 4/2007 | Nakatani et al. | ............ 438/184 |
|---|---|---|---|---|
| 7,279,750 | B2 * | 10/2007 | Jobetto | ....................... 257/347 |
| 2004/0160751 | A1 * | 8/2004 | Inagaki et al. | ................ 361/763 |
| 2005/0156326 | A1 | 7/2005 | Ito | |
| 2005/0211465 | A1 * | 9/2005 | Sunohara et al. | ............ 174/260 |
| 2006/0040463 | A1 * | 2/2006 | Sunohara | .................... 438/424 |

FOREIGN PATENT DOCUMENTS

| CN | 1848419 A | 10/2006 |
|---|---|---|
| JP | 03-094460 A | 4/1991 |
| JP | 9-36172 A | 2/1997 |

(Continued)

OTHER PUBLICATIONS

Chinese Office Action dated Dec. 5, 2008 (7 pages), and English translation thereof (6 pages), issued in a counterpart Chinese Application No. 200710192879.4.
Korean Office Action dated Jun. 29, 2009 and English translation thereof issued in a counterpart—Application No. 10-2007-0121487.
Japanese Office Action (and English translation thereof) dated Oct. 7, 2008, issued in a counterpart Japanese Application.

*Primary Examiner*—David A Zarneke
*Assistant Examiner*—Jenny L Wagner
(74) *Attorney, Agent, or Firm*—Frishauf, Holtz, Goodman & Chick, P.C.

(57) ABSTRACT

A semiconductor device includes a semiconductor component which has a semiconductor substrate provided with an integrated circuit on an under side of the semiconductor substrate and a plurality of external connection electrodes provided on the underside of the semiconductor substrate, and a plurality of interconnections each of which includes one end portion connected to each of the external connection electrodes of the semiconductor component and the other end portion extended outside the semiconductor substrate. An under fill medium is provided to cover at least an underside of the semiconductor substrate and at least the side surfaces of the external connection electrodes. A sealing medium is provided to cover an upper side and a side surface of the semiconductor substrate, and the under fill medium. The undersurface of the under fill medium is flush with the undersurfaces of the interconnections.

17 Claims, 19 Drawing Sheets

FOREIGN PATENT DOCUMENTS

| | | |
|---|---|---|
| JP | 2001-345336 A | 12/2001 |
| JP | 2002-170901 A | 6/2002 |
| JP | 2003-163314 A | 6/2003 |
| JP | 2003-174141 A | 6/2003 |
| JP | 2003-204167 A | 7/2003 |
| JP | 2003-332494 A | 11/2003 |

* cited by examiner

SEMICONDUCTOR DEVICE WITH NO BASE MEMBER AND METHOD OF MANUFACTURING THE SAME

CROSS-REFERENCE TO RELATED APPLICATIONS

This application is based upon and claims the benefit of priority from prior Japanese Patent Application No. 2006-319910, filed Nov. 28, 2006, the entire contents of which are incorporated herein by reference.

BACKGROUND OF THE INVENTION

1. Field of the Invention

This invention relates to a semiconductor device with no base member and a method of manufacturing the semiconductor device.

2. Description of the Related Art

When a semiconductor chip is bonded to a circuit substrate, if the pitch of external connecting terminals of the semiconductor chip is short, it is difficult to perform direct flip-chip packaging. In such a case, the following packaging method is employed. A semiconductor chip is generally mounted on a stacked circuit substrate, called an interposer, to configure a semiconductor device, which is then bonded to a circuit substrate. Jpn. Pat. Appln. KOKAI Publication No. H9-36172 discloses a typical example of a semiconductor device where a semiconductor chip is mounted on an interposer. In the semiconductor device of such a prior art, the interposer includes a double-sided wiring structure wiring substrate of which interconnections provided on the upper surface of the substrate and the interconnections provided on the underside of the substrate are connected through vertical conducting parts. On the upper layer interconnections of the interposer, a semiconductor chip is mounted by the face-down method. On the underside of the lower layer interconnections of the interposer, there are provided a plurality of solder balls. Then, the solder balls are bonded to a circuit substrate by a suitable method, such as reflow techniques.

A semiconductor device described in the prior document has the following problem. Since a relatively expensive interposer having a double-sided wiring structure with vertical conducting parts is used, this leads to high production costs and makes the overall device thicker.

BRIEF SUMMARY OF THE INVENTION

It is an object of the invention to provide a semiconductor device capable of reducing costs and making the devise thinner, and a method of manufacturing the semiconductor device.

According to one aspect of the invention, there is provided a semiconductor device comprising:

a semiconductor component which includes a semiconductor substrate including an integrated circuit on an under side of the semiconductor substrate and a plurality of external connection electrodes provided on the underside of the semiconductor substrate;

a plurality of interconnections each of which includes one end portion connected to each of the external connection electrodes of the semiconductor component and the other end portion extended outside the semiconductor substrate;

an under fill medium which covers at least an underside of the semiconductor substrate and at least the side surfaces of the external connection electrodes; and a sealing medium which covers an upper side and side surface of the semiconductor substrate, and the under fill medium, the undersurface of the under fill medium being flush with the undersurfaces of the interconnections.

According to another aspect of the invention, there is provided a semiconductor device manufacturing method comprising:

preparing an interconnection forming assembly which has an interconnection forming metal foil, a base plate, and a peel layer provided between the interconnection forming metal foil and base plate;

forming interconnections by patterning the interconnection forming metal foil;

bonding to the interconnections a plurality of external connection electrodes of a semiconductor component which includes a semiconductor substrate, said plurality of external connection electrodes being provided on an underside of the semiconductor substrate;

covering at least a part of the semiconductor component and the interconnections with a sealing medium; and removing the base plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

Figure 1:
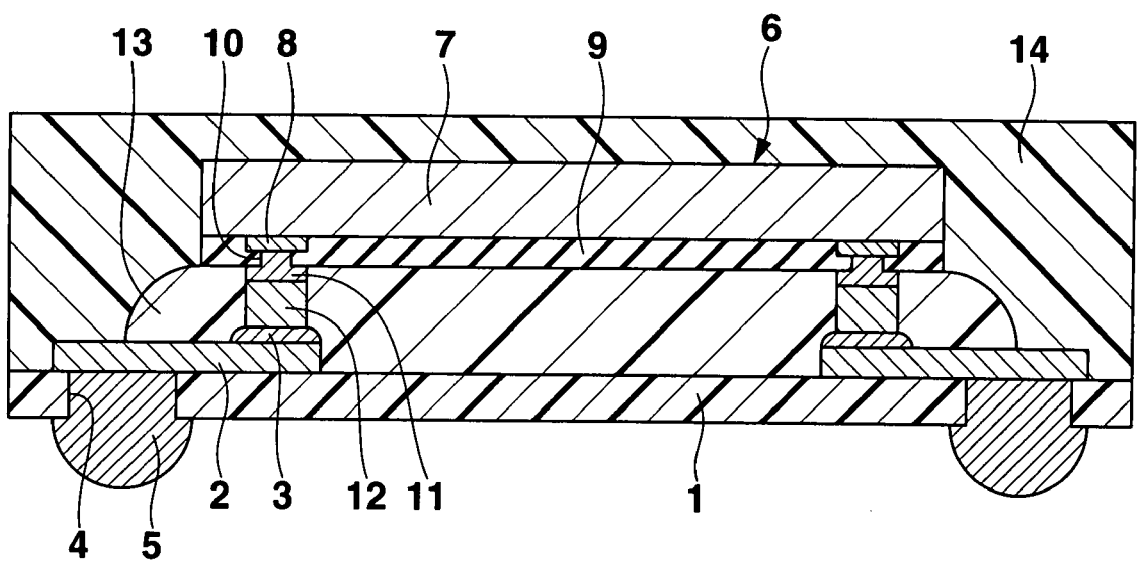
FIG. 1 is a sectional view of a semiconductor device according to a first embodiment of the invention.

FIG. 1 is a sectional view of a semiconductor device according to a first embodiment of the invention. The semiconductor device includes a flat square-shaped lower layer insulating film 1 made of solder resist or the like. On the upper surface of the lower insulating film 1, a plurality of interconnections 2 made of copper foil are provided. On the upper surface of a connection pad at one end of each of the interconnections 2, a surface processed layer 3 made of a tin plating is provided. An opening 4 is made in the insulating film 1 in the part corresponding to the connection pad of the other end of each of the interconnections 2. In and under the opening 4 of the insulating film 1, a solder ball 5 is provided in such a manner the ball is connected to the connection pad of the other end of the interconnection 2 and extended from the opening 4.

Above a central part of the insulating film 1, a flat square-shaped semiconductor component 6 is mounted on the connection pads at said one ends of the plurality of interconnections 2, by the face-down method. The semiconductor component 6 includes a flat square-shaped silicon substrate (semiconductor substrate) 7. On the undersurface of the silicon substrate 7, an integrated circuit (not shown) having a specific function is provided. In the peripheral part of the undersurface, a plurality of connection pads 8 made of aluminum-based metal or the like are provided in such a manner that the pads are electrically connected to the integrated circuit.

On the undersurfaces of the connection pad 8 and silicon substrate 7 excluding the central part of the connection pad 8, there is provided an insulating film 9 composed of inorganic material, such as silicon oxide, or of a laminated structure of inorganic material and organic material, such as polyimide. The central part of the undersurface of each of the connection pads 8 is exposed via an opening 10 formed in the insulating film 9. On the exposed central part of the connection pad 8 and on a part of the undersurface of the insulating film 9 around the exposed undersurface, there is provided an underlying metal layer 11 made of chrome, copper, or the like. On the entire undersurface of each of the underlying metal layers 11, there is provided a projecting electrode (external connection electrode) 12.

The semiconductor component 6 is mounted by the face-down method on the one end side connection pads of the plurality of interconnections 2 above the central part of the lower layer insulating film 1, by a gold-tin eutectic bonding of the projecting electrodes 12 onto the one end side connection pads of the interconnections 2 via the surface processed layers 3.

Between the semiconductor component 6, and the inner side (one end side) portions of the interconnections 2 and lower layer insulating film 1 and around between them, there is provided an under fill medium or layer 13 made of thermosetting resin, such as epoxy resin. On the upper surfaces of the semiconductor component 6, the under fill medium 13, the outer side portions (the other end side) of the interconnections 2, and the peripheral part of the insulating film 1, there is provided a sealing medium or layer 14 made of thermosetting resin, such as epoxy resin. In this state, the sealing medium 14 is provided in an area larger than the arrangement area of the interconnections 2. Moreover, the undersurfaces of the interconnections 2, the under fill medium 13, and the sealing medium 14 are entirely flush with one another.

(Example of a Manufacturing Method)

Figure 2:
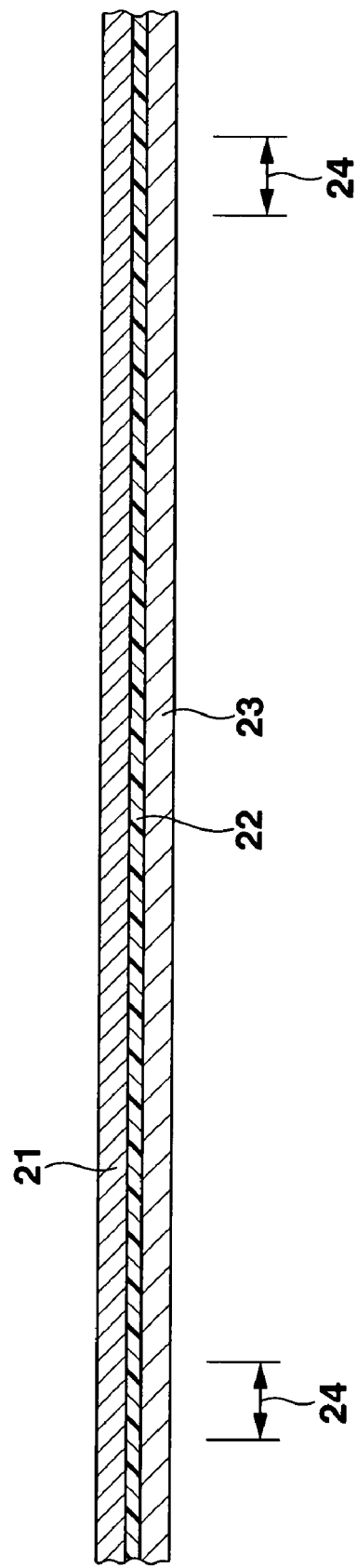
FIG. 2 is a sectional view of an assembly originally prepared in an example of a method of manufacturing the semiconductor device shown in FIG. 1.

Next, one embodiment of a method of manufacturing the aforementioned semiconductor device will be explained. First, as shown in FIG. 2, a peel layer 22 composed of a polyimide film or the like is provided on the undersurface of an interconnection forming metal foil 21 made of copper or the like for forming the interconnections 2 shown in FIG. 1. On the undersurface of the peel layer 22, a base plate 23 made of copper foil is provided. In this case, the size of the resulting assembly is such that a plurality of units of the finished semiconductor device shown in FIG. 1 can be formed. In FIG. 2, regions indicated by reference numeral 24 correspond to cutting lines for segmentation.

Figure 3:
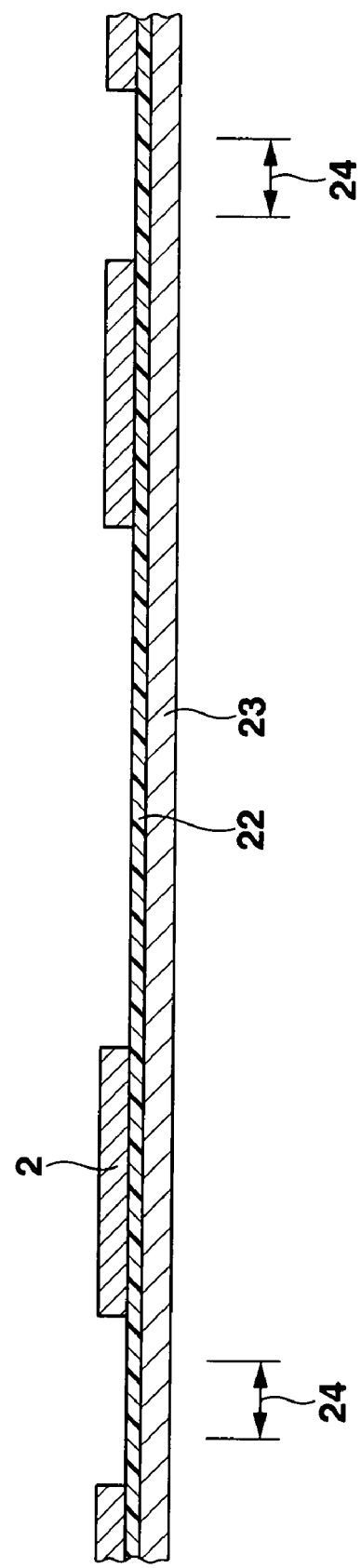
FIG. 3 is a sectional view of a process following FIG. 2.
Figure 4:
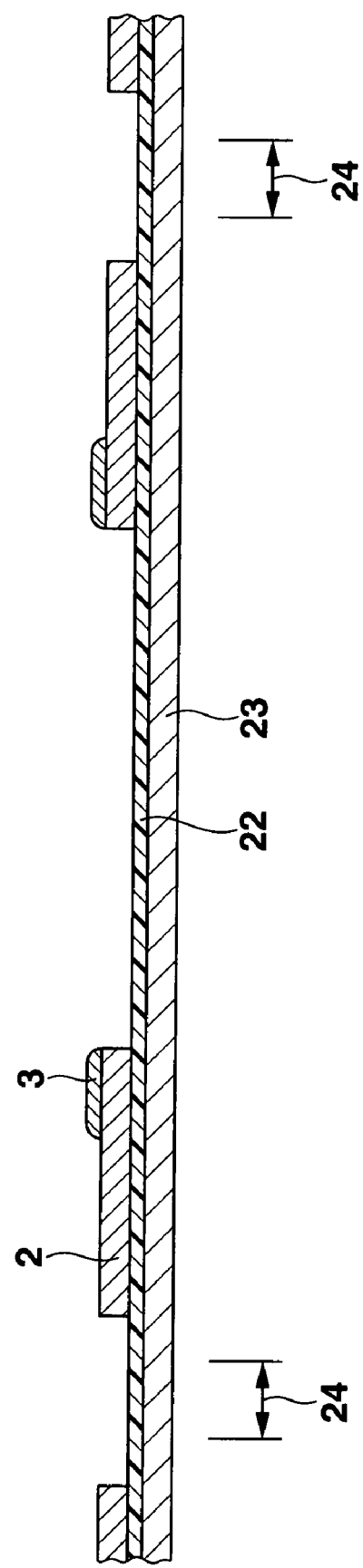
FIG. 4 is a sectional view of a process following FIG. 3.

Next, the interconnection forming metal foil 21 is pattered by photographic techniques, to form a plurality of interconnections 2 on the upper surface of the peel layer 22 as shown in FIG. 3. Then, as shown in FIG. 4, the upper surface of the connection pad at one end of each of the interconnections 2 is subjected to electroless tin plating, thereby forming a surface processed layer 3.

Figure 5:
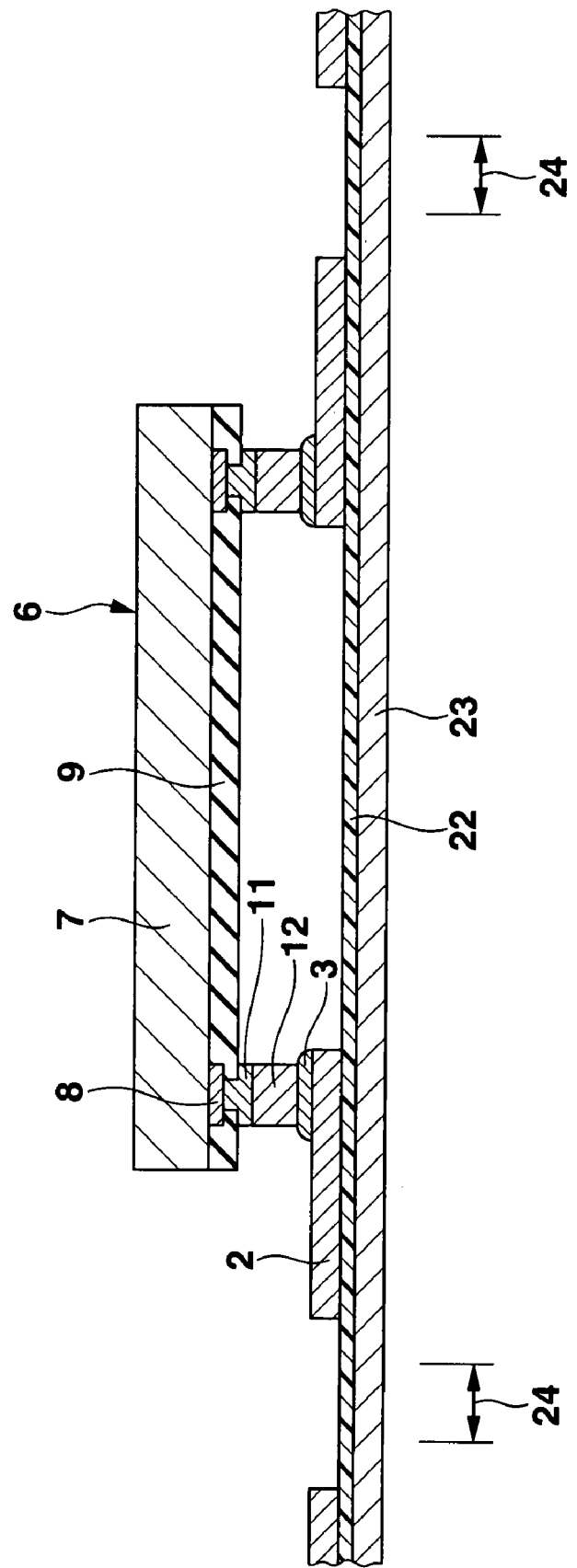
FIG. 5 is a sectional view of a process following FIG. 4.

Next, as shown in FIG. 5, a semiconductor component 6 obtained as follows is prepared. Under a silicon substrate 7 in wafer form, an integrated circuit (not shown), a plurality of connection pads 8 made of aluminum-based metal, an insulating film 9 composed of inorganic material or a laminated structure of inorganic material and organic material, a plurality of underlying metal layers 11 made of chrome, copper, or the like, and a plurality of columnar projecting electrodes 12 made of gold or copper are formed, and then segmenting the resulting assembly by dicing to form a plurality of semiconductor components 6.

Next, the projecting electrode 12 made of gold or copper of the semiconductor component 6 is bonded via the surface processed layer to the connection pad at one end of each of the interconnections 2 made of copper, thereby mounting the semiconductor component 6 on the one end side connection pads of interconnections 2 above the central part of a lower layer insulating film 1 (which is formed by a later described step) by the face-down method.

In the invention, since there is no circuit substrate which supports the semiconductor component 6 as shown in FIG. 1, little or no stress concentration resulting from the difference in thermal expansion coefficient between the semiconductor component 6 and the interconnections 2 occurs at their bond part after the semiconductor component 6 is bonded to the interconnections 2. For this reason, solder bumps or the like to ease the concentrated stress are not needed. When the surface processed layer 3 is pressurized and heated (bonded), the semiconductor component is subjected to gold-tin eutectic bonding if the projecting electrode 12 is gold and to copper-tin metal bonding if the projecting electrode 12 is copper, which enables the reliability of bonding to be secured sufficiently.

In this case, when pressure and heat are applied (for bonding), stress caused by the difference in thermal expansion coefficient between the silicon substrate 7 and interconnections 2 is absorbed as a result of the interconnections 2 shifting (or peeling) horizontally with respect to the base plate 23, using the peel layer 22 as an interface.

Figure 6:
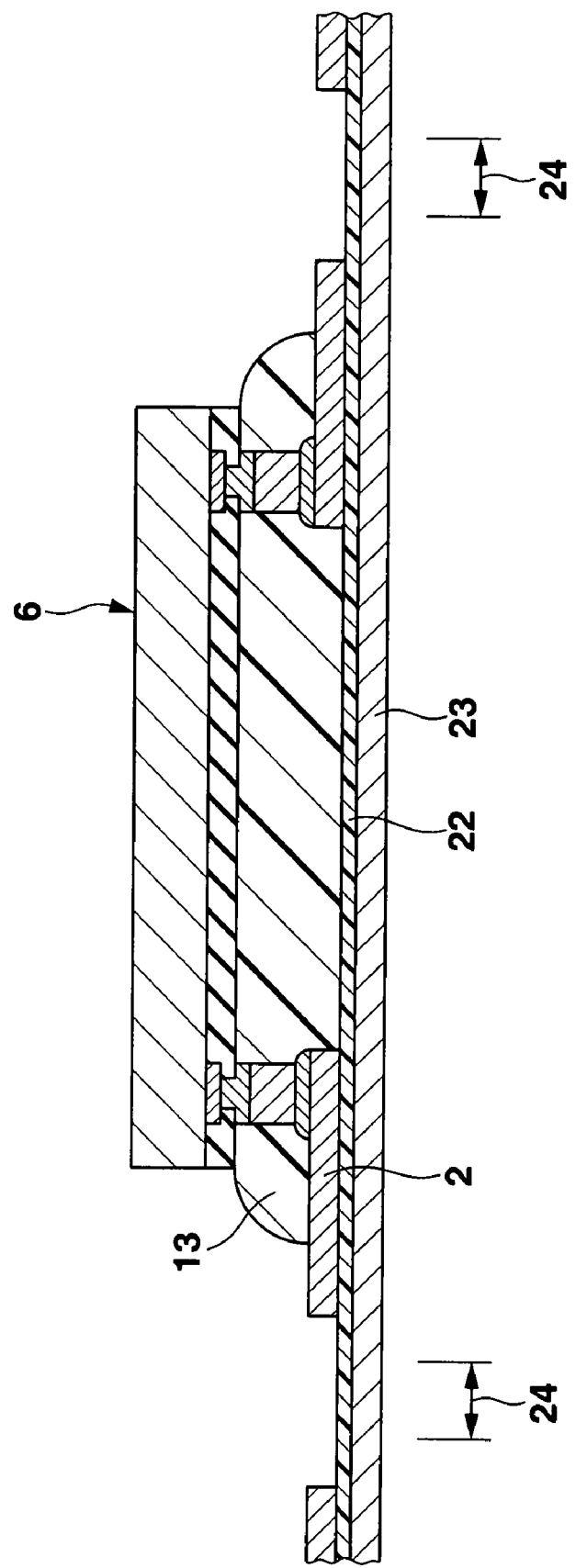
FIG. 6 is a sectional view of a process following FIG. 5.
Figure 7:
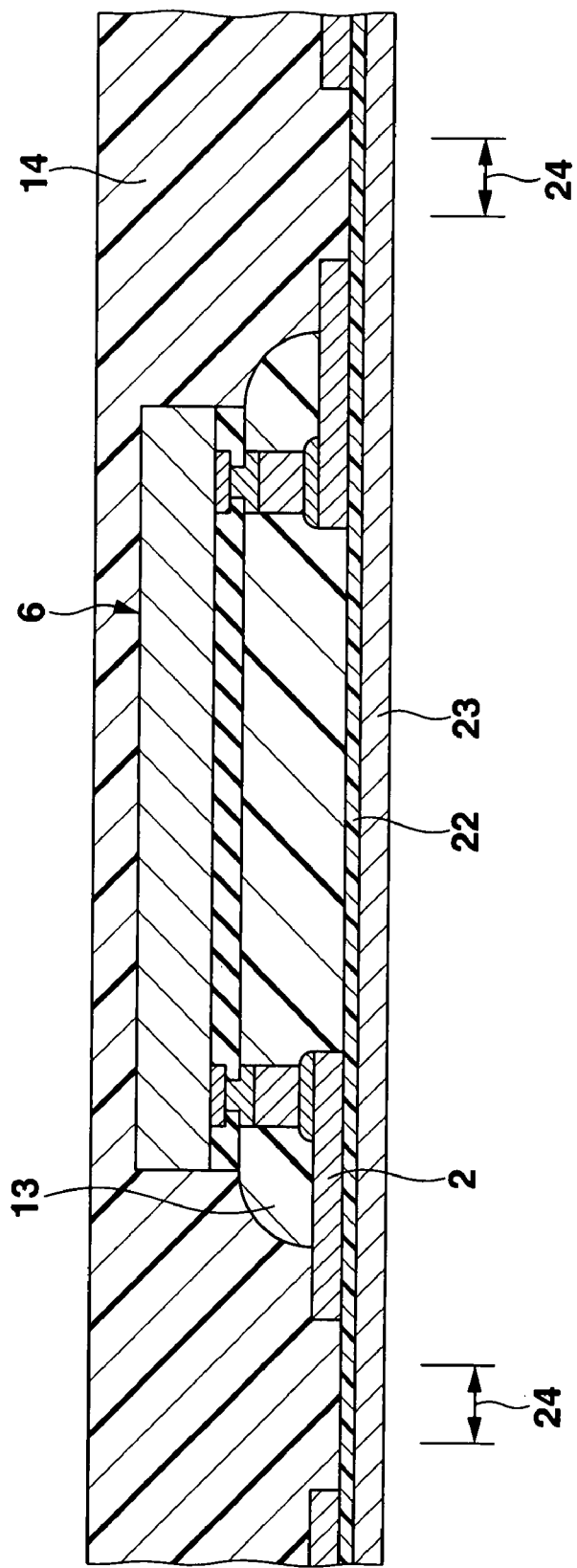
FIG. 7 is a sectional view of a process following FIG. 6.

Next, as shown in FIG. 6, an under fill medium 13 made of thermosetting resin, such as epoxy resin, is filled in a space between the semiconductor component 6, and the inner side parts of the interconnections 2 and a part of the peel layer 22 (later formed insulating film 1), to outwardly extend the space. Next, as shown in FIG. 7, by the screen printing method, spin coat method, transfer molding method, or the like, a sealing medium or layer 14 made of thermosetting resin, such as epoxy resin, is formed on the upper surfaces of the outwardly extended portion of the under fill medium 13, the outer side portions of the interconnections 2, and the peel layer 22.

Figure 8:
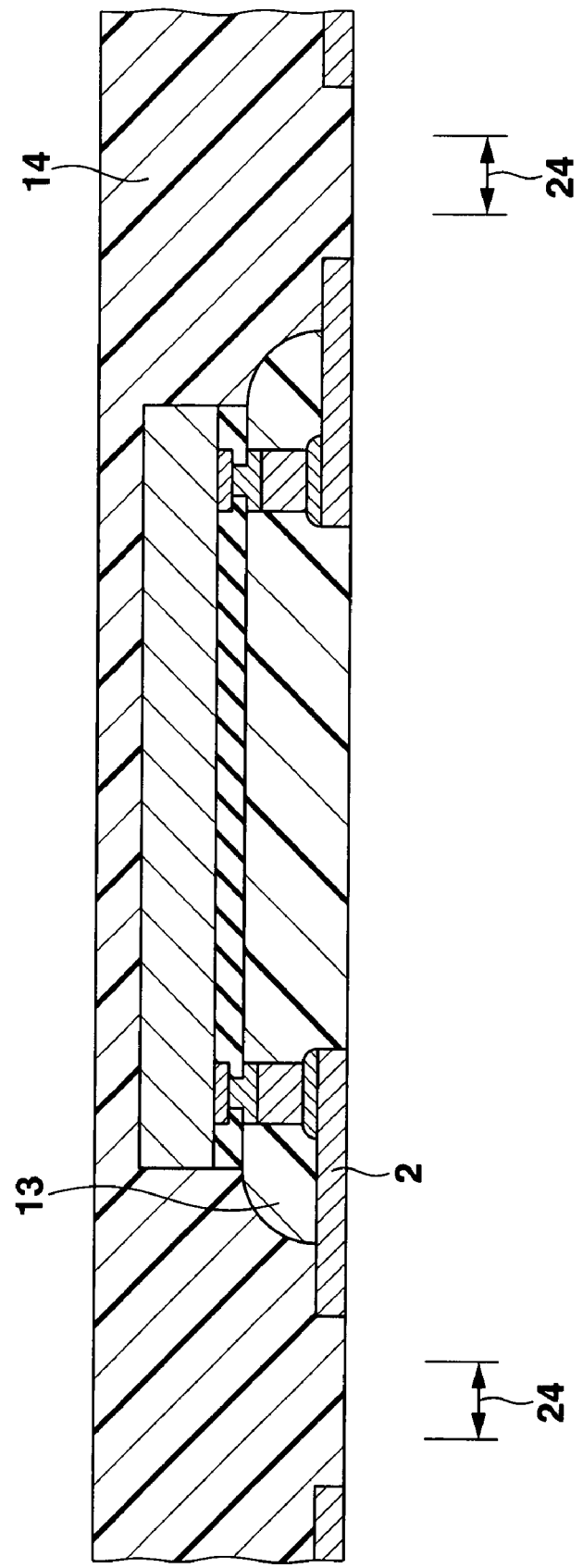
FIG. 8 is a sectional view of a process following FIG. 7.

Next, the base plate 23 is removed by etching the base plate 23 or mechanically peeling the base plate from the peel layer 22. In the case of etching, wet etching is particularly recommended, which is illustrative and not restrictive. Then, the peel layer 22 is removed by etching, thereby exposing the undersurfaces of the interconnections 2, the under fill medium or layer 13, and the sealing medium or layer 14 as shown in FIG. 8. In this state, the undersurfaces of the interconnections 2, the under fill layer 13, and sealing layer 14 are flush with one another. Moreover, in this state, even if the base plate 23 is removed, the presence of the sealing layer 14 and the under fill layer 13 enables the strength to be secured sufficiently.

Here, not only copper foil but also another metal plate such as an aluminum plate, a glass plate, a ceramic plate, or a resin plate may be used as the base plate 23. When copper foil is used as the base plate 23, since an assembly which has copper foils laminated to both sides of a polyimide film serving as the peel layer 22 is commercially available, this laminated film may be used without modification of the film, that is, as it is.

Figure 9:
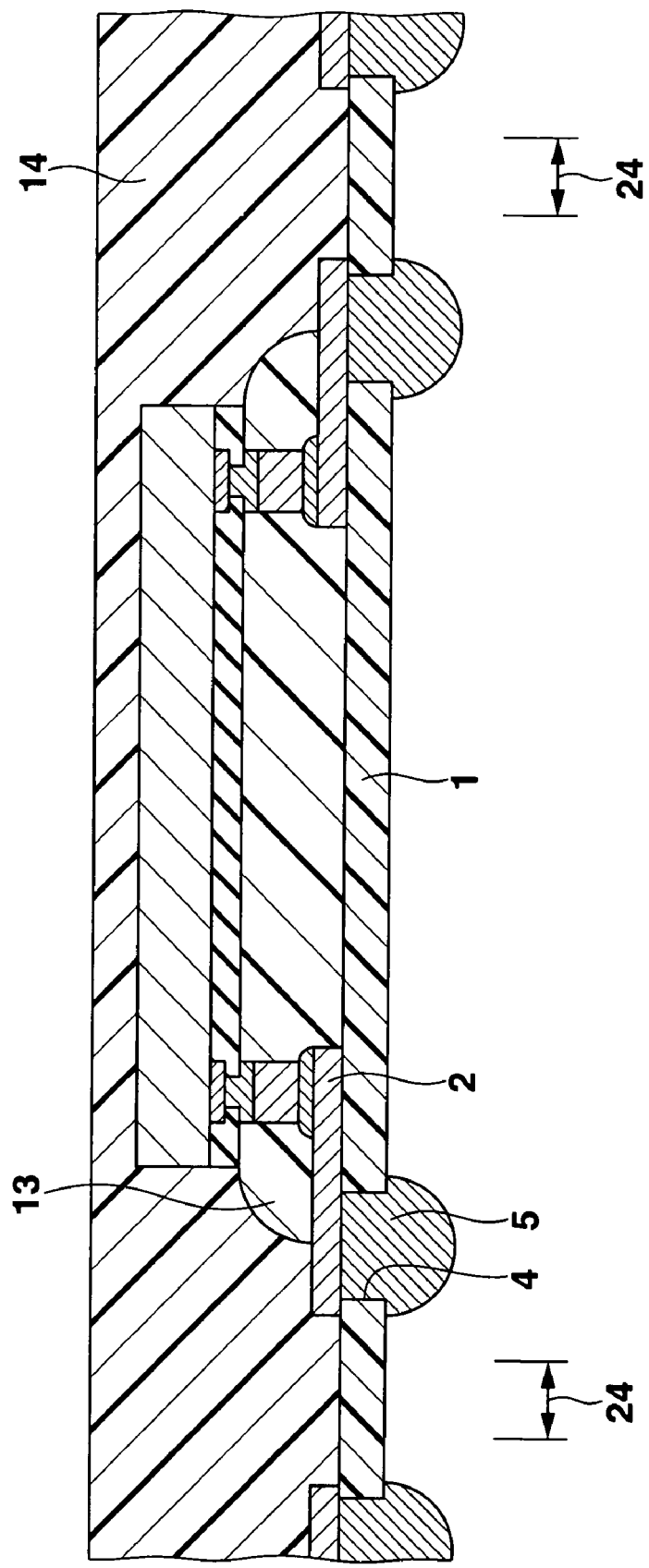
FIG. 9 is a sectional view of a process following FIG. 8.

Next, as shown in FIG. 9, a lower layer insulating film 1 made of solder resist or the like is formed on the entire undersurfaces of the interconnections 2, the under fill medium 13, and the sealing medium 14 by the screen printing method, spin coat method, or the like. Then, by photolithographic techniques, openings 4 are formed in the lower layer insulating film 1 in the parts corresponding to the connection pads at the other ends of the interconnections 2.

Figure 10:
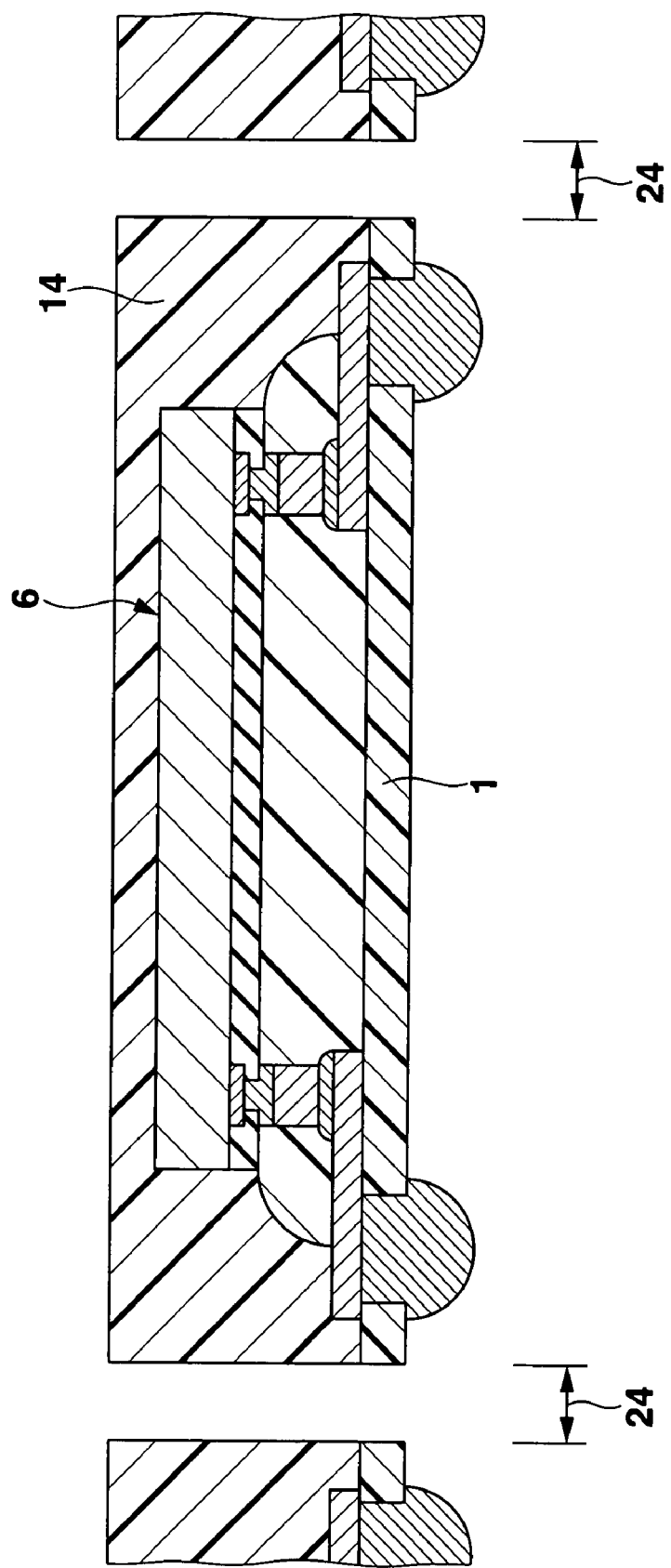
FIG. 10 is a sectional view of a process following FIG. 9.

Next, solder balls 5 are formed in and under the openings 4 in the lower layer insulating film 1 in such a manner that the balls are electrically connected to the connection pads at the other ends of the interconnections 2, and extended from the film 1. Then, as shown in FIG. 10, between the adjacent semiconductor components 6, the sealing medium 14 and lower layer insulating film 1 are cut along the cutting lines 24, thereby obtaining a plurality of the semiconductor devices shown in FIG. 1.

Each of the semiconductor devices configured as described above has such a structure that the interconnections 2 are embedded in the undersides of the sealing medium or layer 14 and the under fill medium or layer 13, which enables the strength to be secured sufficiently. The semiconductor component 6 is bonded to the connection pads at the one or inner ends of the embedded interconnections 2 by the face-down method. Solder balls 5 are provided under the connection pads at the other or outer ends of the interconnections 2. With this configuration, since a relatively expensive interposer which has a double-sided wiring structure with vertical conducting parts is not used, the production costs can be reduced and the device can be made thinner.

(Another Example of the Manufacturing Method)

Figure 11:
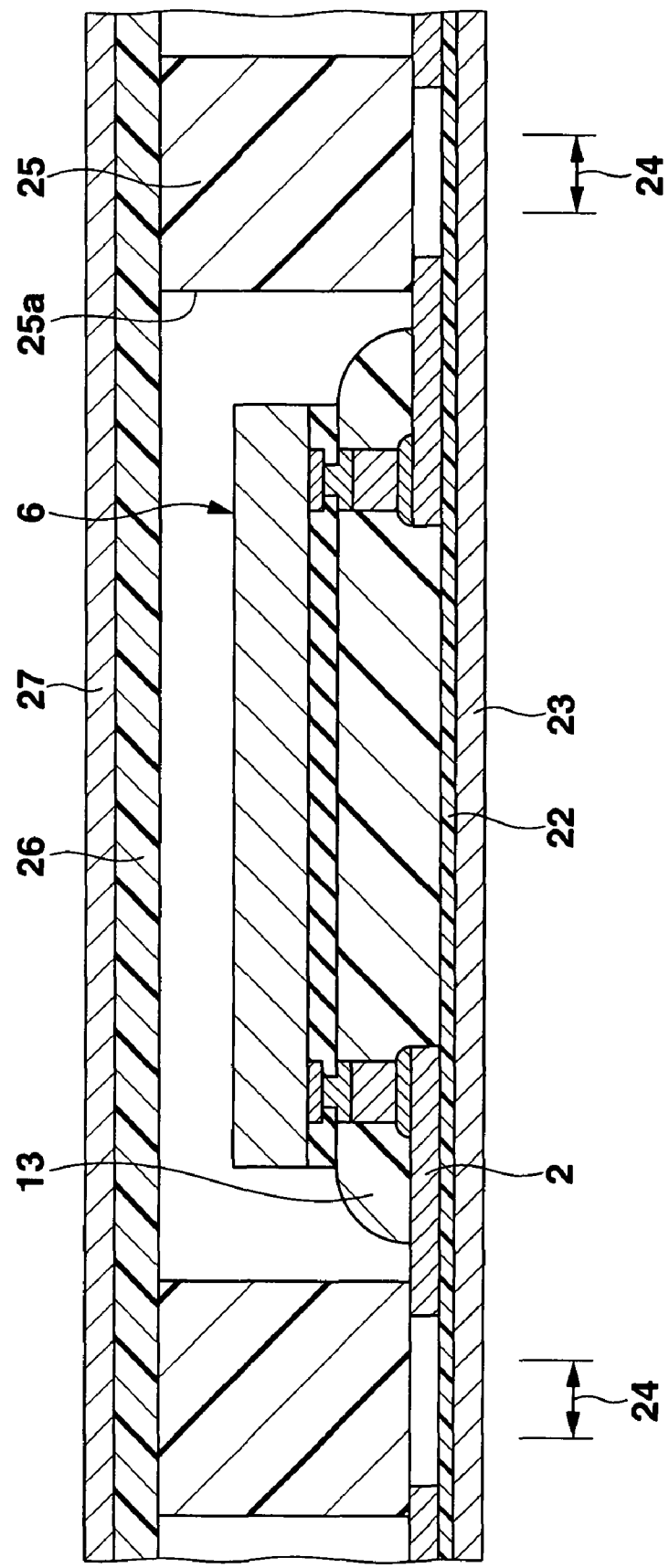
FIG. 11 is a sectional view of a specific process in another example of the method of manufacturing the semiconductor device shown in FIG. 1.

Next, another example of the method of manufacturing the semiconductor device of FIG. 1 will be explained. In this case, after the process shown in FIG. 6, a first lattice-shaped sealing medium forming sheet 25 is arranged on the upper surfaces of the outer ends of the interconnections 2 above the peel layer 22, so that each of the semiconductor components 6 is positioned in each of plurality of square openings 25a formed in the sheet 25, while positioning the sheet 25 with pins or the like, as shown in FIG. 11.

The first lattice-shaped sealing medium forming sheet 25 is such that a base material made of glass fabric or the like is impregnated with thermosetting resin, such as epoxy resin, the thermosetting resin is half-hardened in sheet form, and the square openings 25a are formed in the sheet by punching or the like. In this case, the thickness of the sheet 25 is somewhat greater than the height of the semiconductor component 6.

Next, a second sealing medium forming sheet 26 is provided on the entire upper surface of the first sealing medium forming sheet 25. The second sheet 26 is made of the same material as that of the first sheet 25. That is, the second sheet 26 is formed in such a manner that a base material made of glass fabric or the like is impregnated with thermosetting resin, such as epoxy resin, and the thermosetting resin is half-hardened in sheet form. Then, a protective copper foil 27 is provided on the upper surface of the second sealing medium forming sheet 26.

Figure 12:
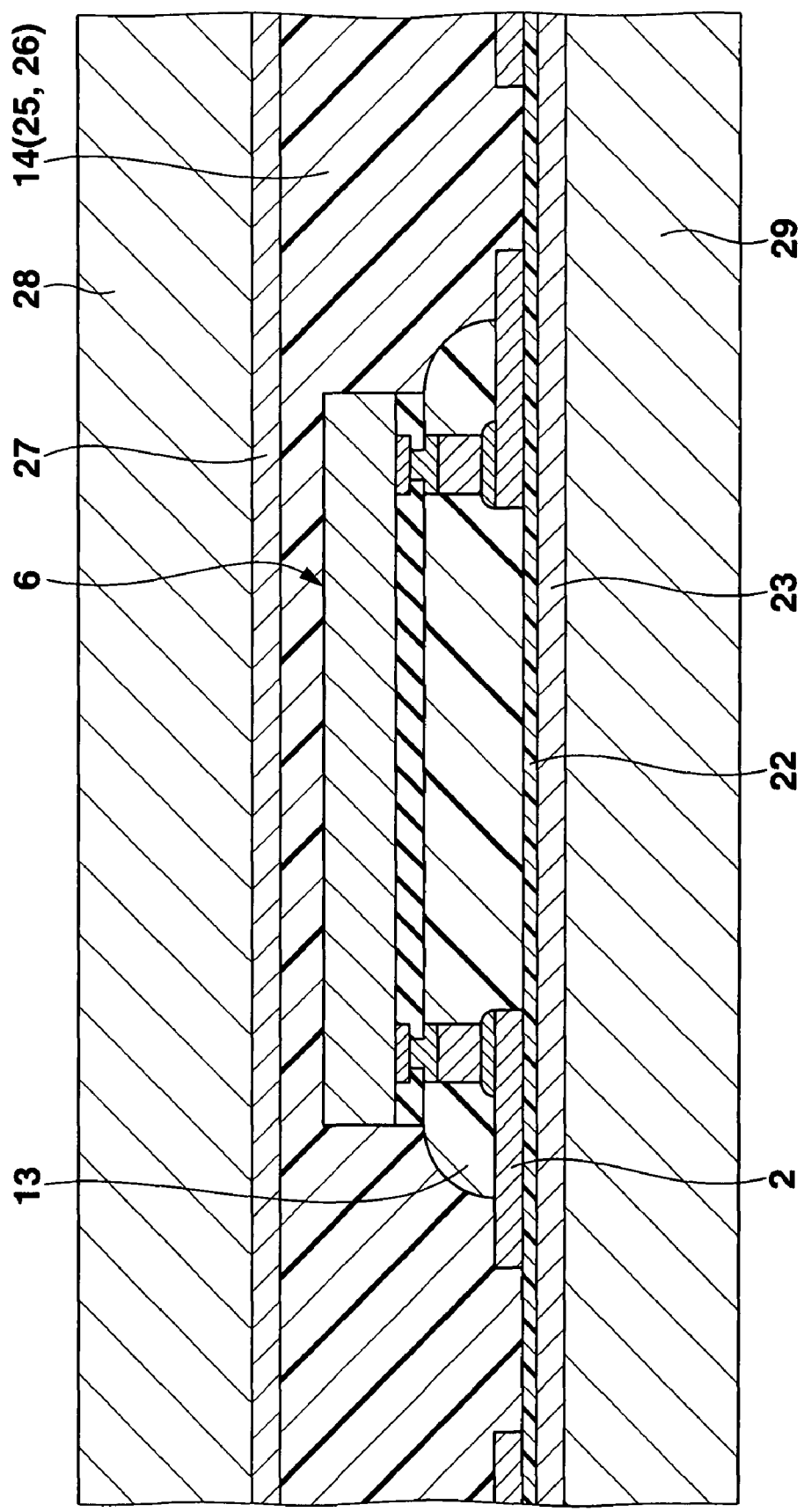
FIG. 12 is a sectional view of a process following FIG. 11.

Next, as shown in FIG. 12, the first and second sealing medium forming sheets 25, 26 are heated and pressurized from above and below using a pair of heating and pressure plates 28, 29, so that both sheets 25, 26 are deformed and integrated with each other, and thereafter, by cooling. Thus a sealing medium or layer 14 is formed by the sheets 25, 26, which is formed on the upper surfaces of the semiconductor component 6, the outer peripheral portions of the under fill mediums 13, the outer end portions of the interconnections 2, and the lower layer insulating film 1. Then, the protective copper foil 27 is fixed firmly to the upper surface of the sealing medium 14.

In this case, the protective copper foil 27 is for preventing thermosetting resin, such as epoxy resin, from adhering unnecessarily to the undersurface of the upper heating and pressure plate 28 and for enabling the upper heating and pressure plate 28 to be reused as it is. Next, the protective copper foil 27 is removed by etching. Moreover, the base plate 23 and peel layer 22 are removed by etching or the like, which produces what is shown in FIG. 8. The wet etching method is particularly recommended as the etching of the protective copper foil 27 and base plate 23, which is illustrative and not restrictive.

Thereafter, through the same processes as those in the example of the manufacturing method, a plurality of semiconductor devices shown in FIG. 1 are obtained. In the semiconductor device obtained in this way, since the sealing medium 14 is composed of a base material made of glass fabric or the like impregnated with thermosetting resin, such as epoxy resin, the strength of the sealing medium 14 may be made greater than a case where the sealing medium is made of only thermosetting resin, such as epoxy resin.

Second Embodiment

Figure 13:
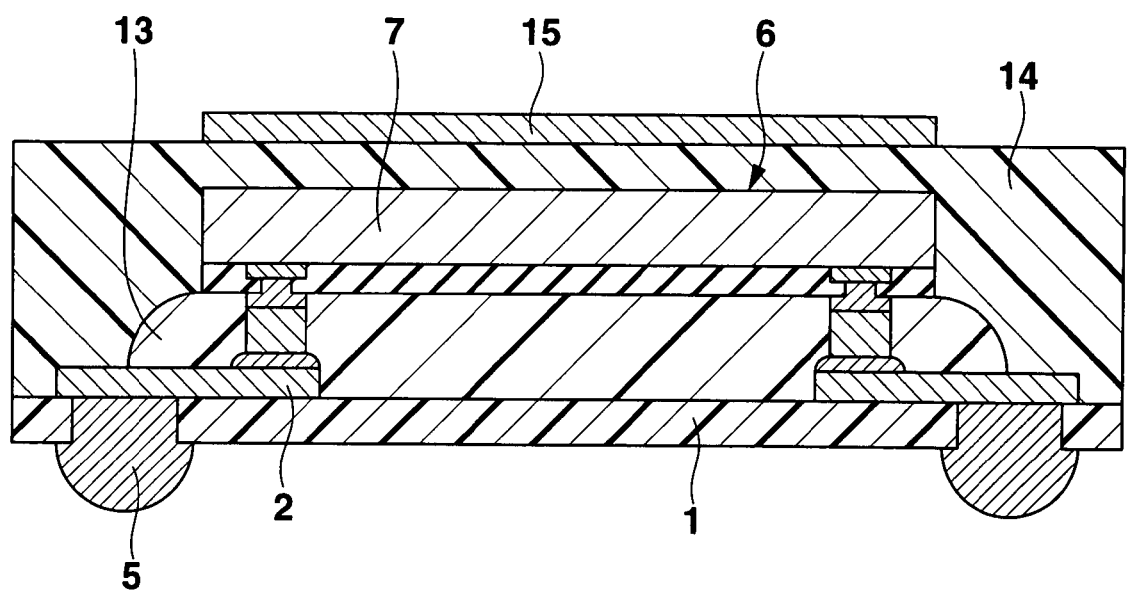
FIG. 13 is a sectional view of a semiconductor device according to a second embodiment of the invention.

FIG. 13 is a sectional view of a semiconductor device according to a second embodiment of the invention. The semiconductor device of the second embodiment differs from that of FIG. 1 in that a heat dissipation layer 15 made of copper foil is provided on the upper surface of the sealing medium 14 to face the semiconductor component 6, thereby improving the dissipation characteristic of heat generated from the semiconductor substrate 7. It is preferable that dimensions of the dissipation layer 15 are the same or larger than those of the semiconductor component 6. In this case, since the heat dissipation layer 15 can be formed by, for example, patterning the protective copper foil 27 of FIG. 12 by photolithographic techniques, it is possible to effectively use the protective copper foil 27 for preventing thermosetting resin, such as epoxy resin, from adhering unnecessarily to the undersurface of the upper heating and pressure plate 28.

Third Embodiment

Figure 14:
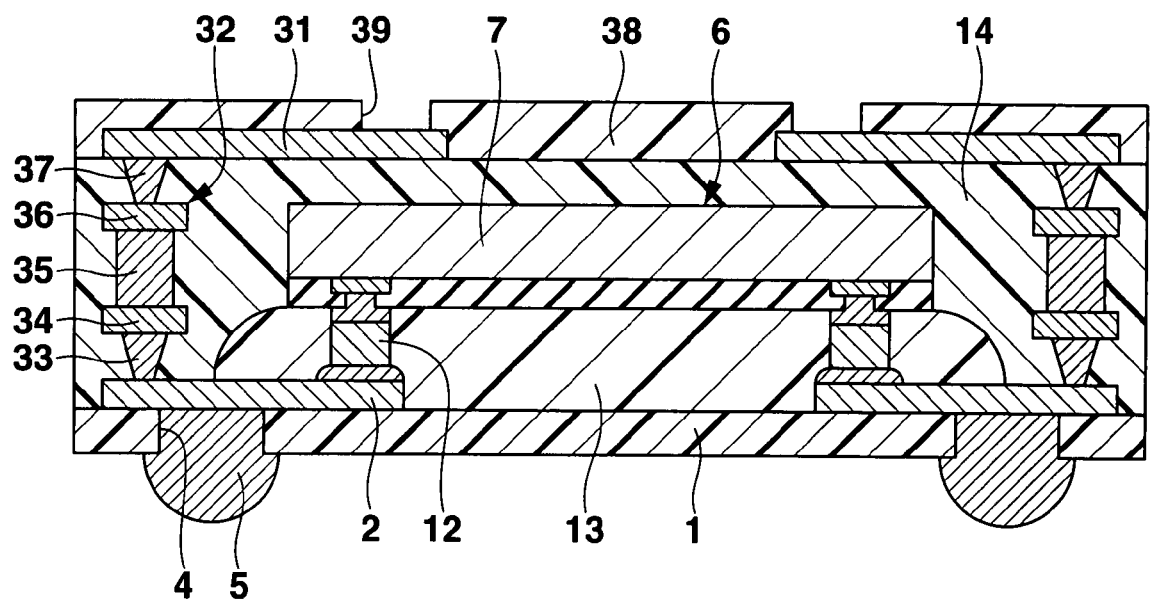
FIG. 14 is a sectional view of a semiconductor device according to a third embodiment of the invention.

FIG. 14 is a sectional view of a semiconductor device according to a third embodiment of the invention. The semiconductor device of the third embodiment differs substantially from that of FIG. 1 in that a plurality of upper layer interconnections 31 are provided on the upper surface of the sealing medium 14. One end of each of the upper layer interconnections 31 is electrically connected to the other end of each of the interconnections 2 via a vertical conducting assembly 32 provided in the sealing medium 14 around the semiconductor component 6.

The vertical conducting assembly 32 is composed of a lower cone-shaped projecting electrode 33, a lower connection wire 34, a vertical connection part 35, an upper connection line 36, and an upper cone-shaped projecting electrode 37 mounted on the outer end portion of the interconnection 2 in this order, which are provided in the sealing medium 14 around the semiconductor component 6. On the upper surfaces of the sealing medium 14 and the upper layer interconnections 31, an overcoat film 38 made of solder resist or the like is provided. Openings 39 are formed in the overcoat film 38 in the parts corresponding to the inner end portions or connection pads of the upper layer interconnections 31.

Figure 15:
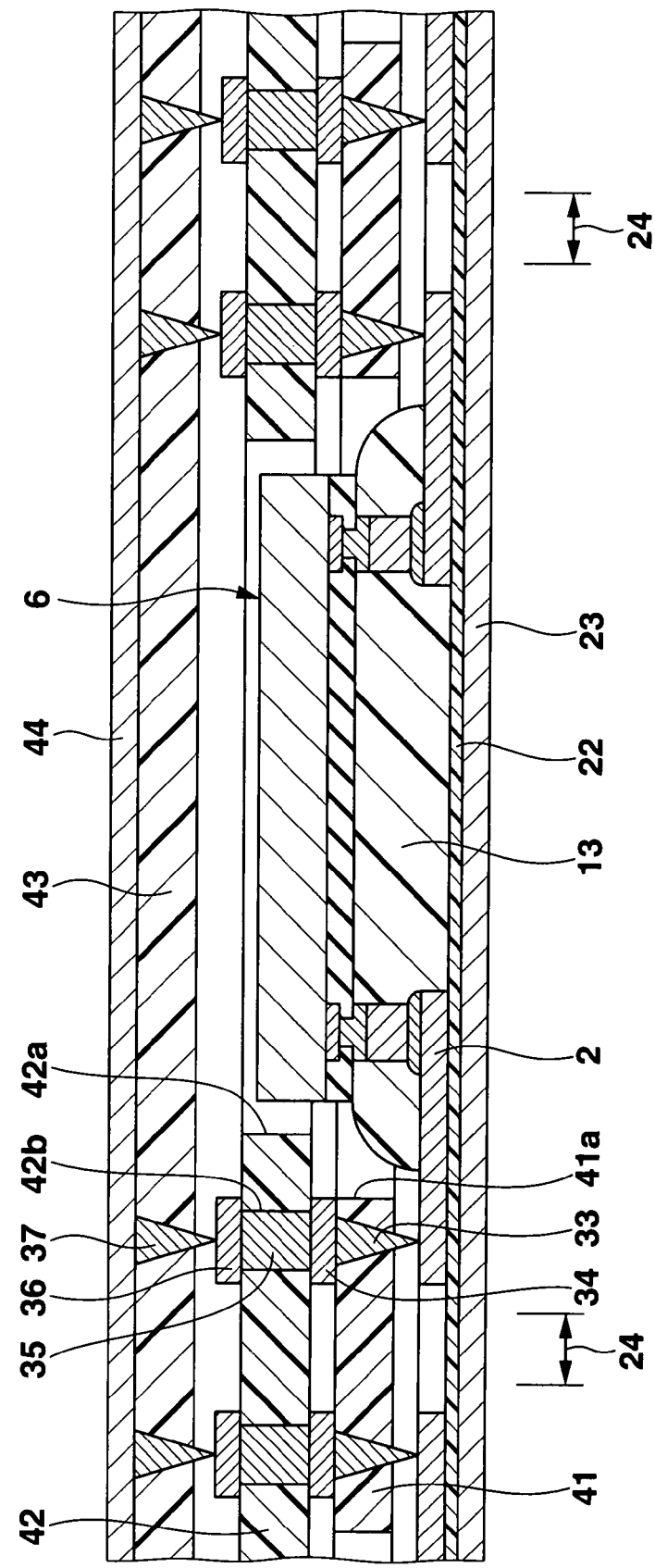
FIG. 15 is a sectional view of a specific process in a method of manufacturing the semiconductor device shown in FIG. 14.

Next, an example of a method of manufacturing the semiconductor device will be explained. In this case, after the process shown in FIG. 6, first and second lattice-shaped sealing medium forming sheets 41, 42 are provided on the upper surfaces of the outer end portions of the interconnections 2 around the semiconductor components 6 in this order, while the sheets 41, 42 are being positioned with pins or the like, as shown in FIG. 15. On these, a third sealing medium forming sheet 43 and an upper layer interconnection forming metal foil 44 are provided. The upper layer interconnection forming metal foil 44 is made of copper or the like.

In this case, too, the first and second lattice-shaped sealing medium forming sheets 41, 42 are made in such a manner that a base material made of glass fabric or the like is impregnated with thermosetting resin, such as epoxy resin, the thermosetting resin is half-hardened in sheet form, and a plurality of square openings 41a, 42a are made in the sheets by punching or the like. The third sealing medium forming sheet 43 is made of the same material as that of the first and second sealing medium forming sheets 41, 42. That is, the third sealing medium forming sheet 43 is made in such a manner that a base material made of glass fabric or the like is impregnated with thermosetting resin, such as epoxy resin, and the thermosetting resin is half-hardened in sheet form.

A plurality of openings 42b are made in the second sealing medium forming sheet 42 by photolithographic techniques or by laser processing with laser irradiation. In the openings 42b, vertical connection parts 35 composed of metal paste, conducting pins, and others are provided. Copper foils each laminated on the upper surface and undersurface of the second sealing medium forming sheet 42 are respectively patterned to form the upper connection wire 36 and the lower connection wire 34 to be connected to each other via the vertical connection part 35.

On the undersurface of the lower connection wire 34, a lower cone-shaped projecting electrode 33 is formed by applying metal paste by screen printing or the like. With the first sealing medium forming sheet 41 being slightly heated, the lower cone-shaped projecting electrode 33 is stuck into the first sealing medium forming sheet 41 until it runs through the sheet 41, thereby firmly fixing the first sheet 41 to the undersurface of the second sheet 42 temporarily.

Furthermore, on the undersurface of the upper layer interconnection forming metal foil 44, an upper cone-shaped projecting electrode 37 is formed by applying metal paste by screen printing or the like. With the third sealing medium forming sheet 43 being slightly heated, the upper cone-shaped projecting electrode 37 is stuck into the third sealing medium forming sheet 43 until it runs through the sheet 43, thereby firmly fixing the third sealing medium forming sheet 43 to the undersurface of the upper layer interconnection forming metal foil 44 temporarily.

Figure 16:
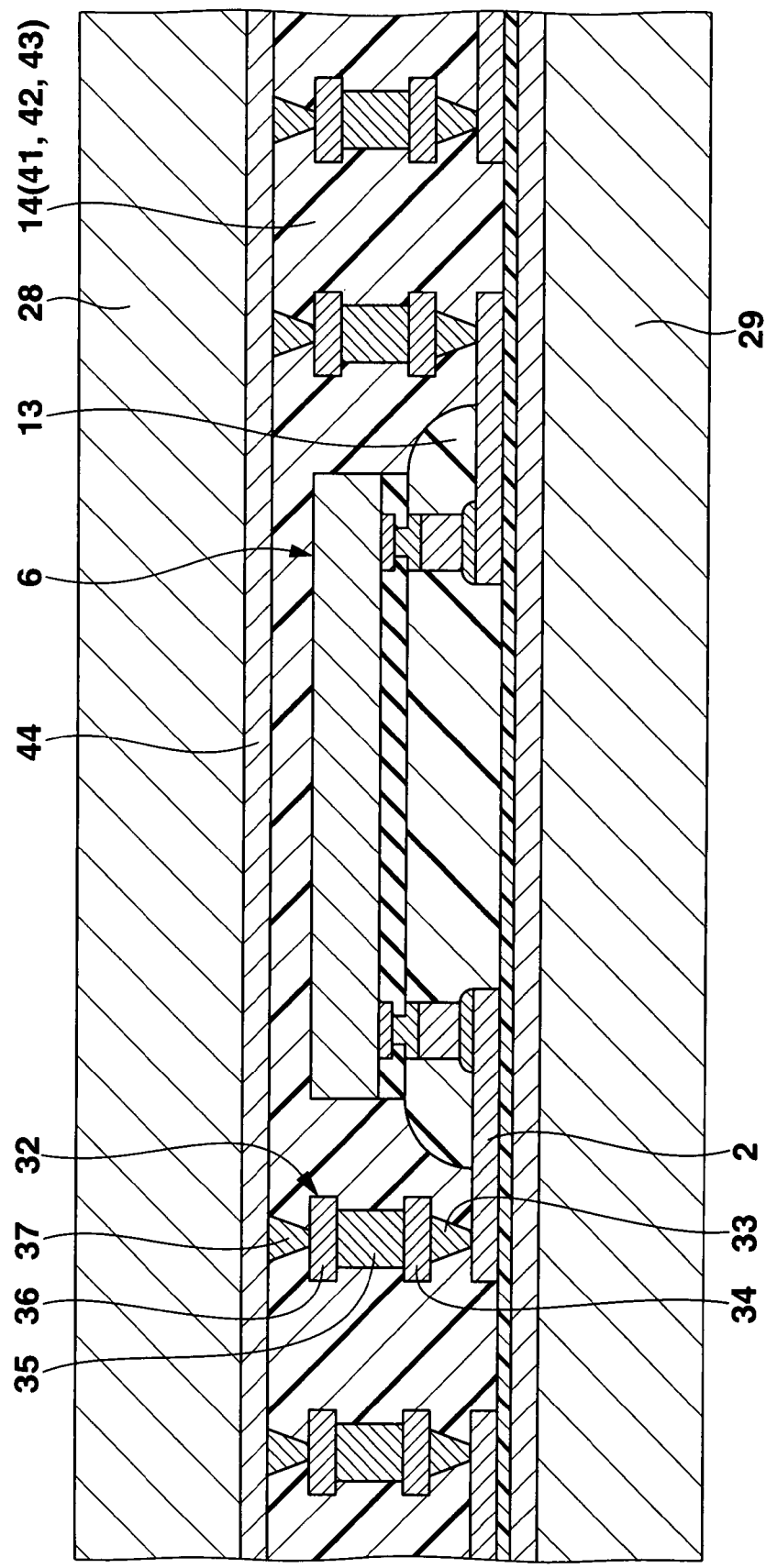
FIG. 16 is a sectional view of a process following FIG. 15.

Next, as shown in FIG. 16, the first, second, and third sealing medium forming sheets 41, 42, 43 are heated and pressurized from above and below using a pair of heating and pressure plates 28, 29. Thereafter, by cooling, a sealing medium 14 is formed on the upper surfaces of the semiconductor components 6, the under fill mediums 13, the interconnections 2, and the lower layer insulating film 1. At the same time, the upper layer interconnection forming copper foil 44 is fixed firmly to the upper surface of the sealing medium 14.

Furthermore, the lower part of the lower projecting electrode 33 is pressed against the upper surface of the other end of each of the interconnections 2 and gets crushed suitably. At the same time, the lower part of the upper projecting electrode 37 is pressed against the upper surface of the upper connection wire 36 and gets crushed suitably. This causes the upper layer interconnection forming metal foil 44 to be connected to the upper surface of the other end of the interconnection 2 via the vertical conducting assembly 32 composed of the lower cone-shaped projecting electrode 33, the lower connection wire 34, the vertical connection part 35, the upper connection wire 36, and the upper cone-shaped projecting electrode 37 provided in the sealing medium 14 around the semiconductor component 6. In this case, the upper layer interconnection forming metal foil 44 has the function of preventing thermosetting resin, such as epoxy resin, from adhering unnecessarily to the undersurface of the upper heating and pressure plate 28.

Figure 17:
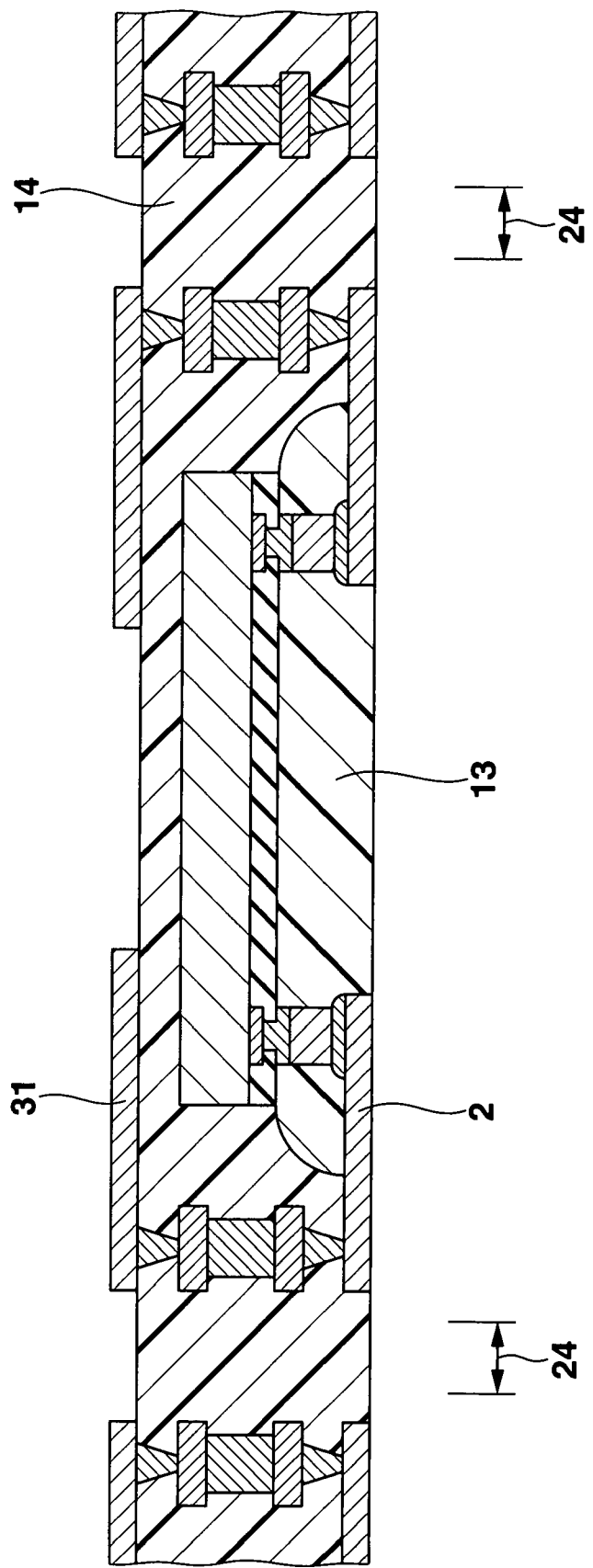
FIG. 17 is a sectional view of a process following FIG. 16.

Next, the base plate 23 and peel layer 22 are removed by etching, and then the upper layer interconnection forming metal foil 44 is patterned by photolithographic techniques, thereby exposing the undersurfaces of the interconnections 2, the under fill mediums 13, and the sealing medium 14. Next, upper layer interconnections 31 are formed on the upper surface of the sealing medium 14 as shown in FIG. 17. In this state, the undersurfaces of the interconnections 2, the under fill mediums 13, and the sealing medium 14 are flush with one another.

Figure 18:
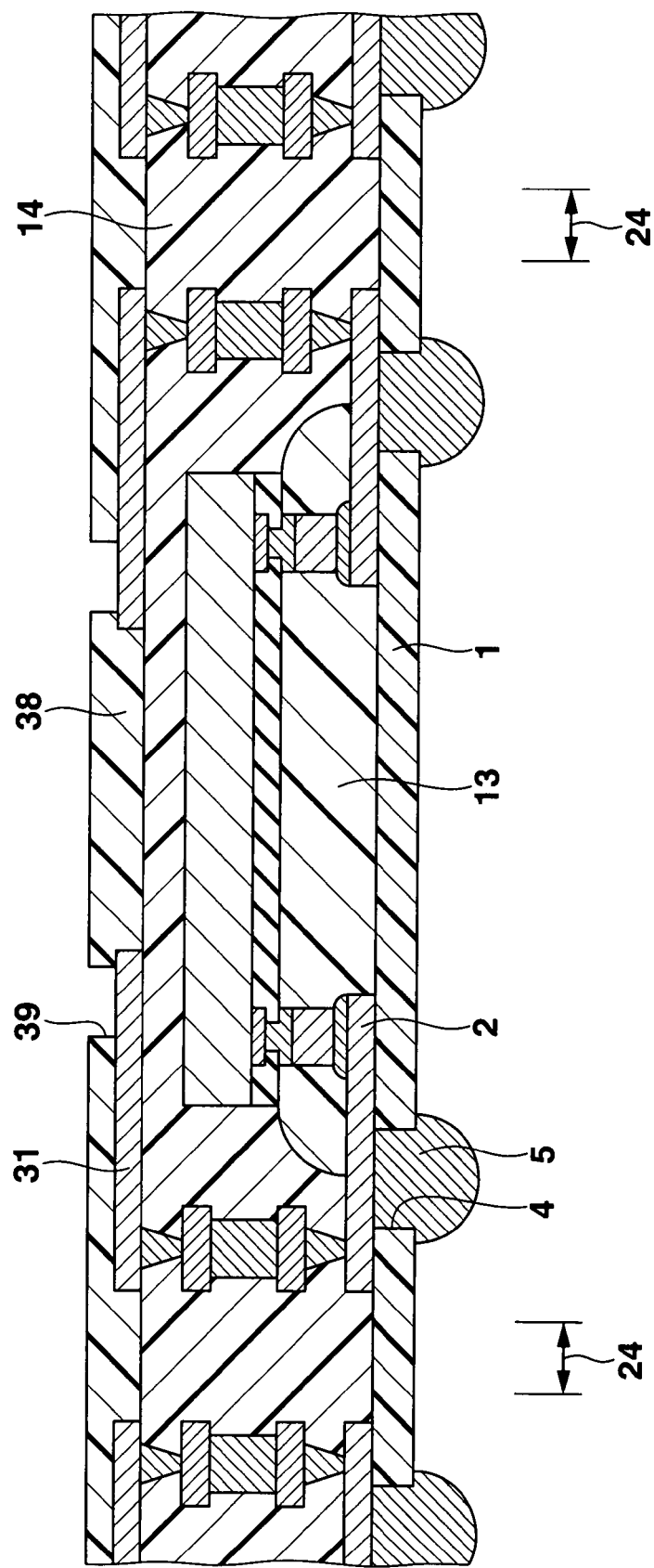
FIG. 18 is a sectional view of a process following FIG. 17.

Next, as shown in FIG. 18, a lower layer insulating film 1 made of solder resist or the like is formed on the entire undersurfaces of the interconnections 2, the under fill mediums 13, and the sealing medium 14 by the screen printing method, spin coat method, or the like. At the same time, an overcoat film 38 made of solder resist or the like is formed on the entire upper surfaces of the sealing medium 14 and the upper layer interconnections 31. Next, openings 4 are made in the lower layer insulating film 1 in the parts corresponding to the connection pads at the other ends of the interconnections 2. At the same time, openings 39 are made in the overcoat film 38 in the parts corresponding to the connection pads of the upper layer interconnections 31.

Figure 19:
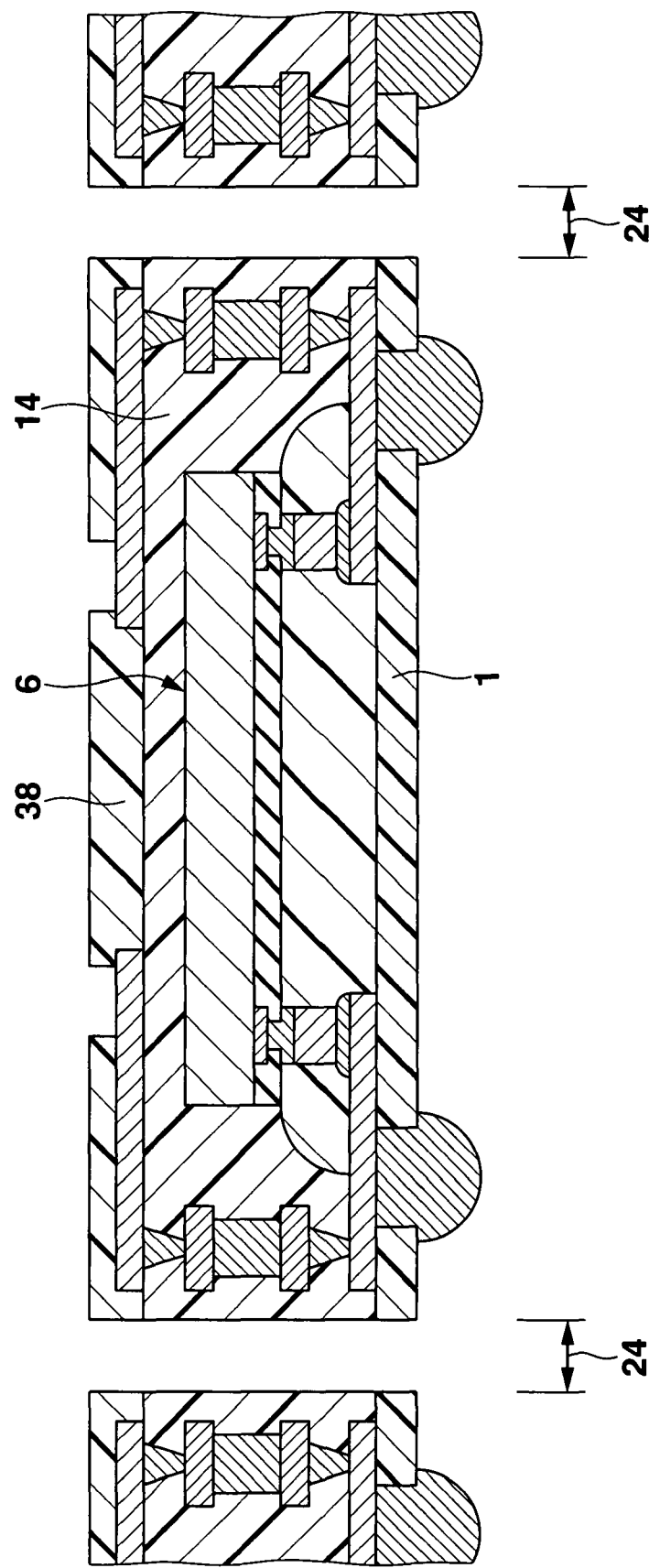
FIG. 19 is a sectional view of a process following FIG. 18.

Next, solder balls 5 are formed in and under the openings 4 in the lower layer insulating film 1 in such a manner that the balls are electrically and mechanically connected to the connection pads at the other ends of the interconnections 2. Then, as shown in FIG. 19, between adjacent semiconductor components 6, the overcoat film 38, the sealing medium 14, and the lower layer insulating film 1 are cut along the cutting lines 24, thereby obtaining a plurality of semiconductor devices shown in FIG. 14.

In the semiconductor device obtained in this way, the upper layer interconnections 31 are provided on the upper surface of the sealing medium 14 so as to be respectively connected to the interconnections 2 via the vertical conducting assemblies 32 vertically extending through the sealing layer 14. The regions other than the connection pads of the upper layer interconnections are covered with the overcoat film 38 and the connection pads of the interconnections 31 are exposed via the openings 39 formed in the overcoat film 38. Therefore, on the exposed connection pads of the interconnections 31, chip parts, including resistors and capacitors, or other semiconductor components can be mounted.

With the invention, a semiconductor component is mounted on the interconnections by the face-down method by bonding the external connection electrodes to the interconnections in such a manner that at least a part of the semiconductor component and interconnections is covered with the sealing medium and that the undersurface of the sealing medium is flush with the undersurfaces of the interconnections. Accordingly, since a relatively expensive interposer which has a double-sided wiring structure with vertical conducting parts is not used in the invention, the production costs can be reduced and the semiconductor device can be made thinner.

In the above embodiments, parts of the plurality of interconnections 2 may be extended so not to be covered with the sealing medium 14 and the connecting terminals of a circuit substrate or a connecting member may be joined to the upper surface of the extended parts. Furthermore, the under fill medium 13 may be made of the same material as that of the sealing medium 14. In that case, they may be formed simultaneously in the process of forming the sealing medium 14.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    preparing an interconnection forming assembly which includes an interconnection forming metal foil, a base plate, and a peel layer provided between the interconnection forming metal foil and base plate;
    forming interconnections by patterning the interconnection forming metal foil;
    bonding to the interconnections a plurality of external connection electrodes of a semiconductor component which includes a semiconductor substrate, said plurality of external connection electrodes being provided on an underside of the semiconductor substrate;
    covering at least a part of the semiconductor component and the interconnections with a sealing medium; and
    removing the base plate;
    wherein covering at least the part of the semiconductor component and the interconnections with the sealing medium includes:
        providing a first sealing medium forming sheet on the interconnections and peel layer, the first sealing medium forming sheet including an opening in which the semiconductor component is held;
        providing a second sealing medium forming sheet on the first sealing medium forming sheet, the second sealing medium forming sheet including an opening in which the semiconductor component is held and a lower vertical conducting part;
        providing a third sealing medium forming sheet on the second sealing medium forming sheet;
        providing an upper layer interconnection forming metal foil on the third sealing medium forming sheet, the upper layer interconnection forming metal foil including upper vertical conducting parts on an undersurface thereof; and
        heating and pressing the first, second, and third sealing medium forming sheets and the upper layer interconnection forming metal foil from above and below, thereby forming the sealing medium from the first, second, and third sealing medium forming sheets;
    wherein at least one of the first sealing medium forming sheet and the third sealing medium forming sheet is penetrated by at least one projection electrode; and
    wherein said at least one projection electrode projects from a surface of one of the first sealing medium forming sheet and the third sealing medium forming sheet before the heating and pressing, and changes shape in the heating and pressing by contact with the lower vertical conducting part.

2. The semiconductor device manufacturing method according to claim 1, wherein removing the base plate includes removing the base plate by wet etching.

3. The semiconductor device manufacturing method according to claim 1, further comprising forming an under fill medium between the semiconductor component and the peel layer before covering at least the part of the semiconductor component and the interconnections with the sealing medium.

4. The semiconductor device manufacturing method according to claim 1, wherein removing the base plate includes removing the peel layer.

5. The semiconductor device manufacturing method according to claim 3, further comprising:
    forming a solder resist layer on undersurfaces of the interconnections exposed after the removal of the base plate and peel layer and on undersurfaces of the under fill medium and the sealing medium;
    wherein each of the interconnections includes a connection pad positioned at the undersurface thereof; and
    wherein the solder resist layer includes a plurality of openings formed in parts corresponding to the connection pads of the interconnections.

6. The semiconductor device manufacturing method according to claim 5, further comprising:
    after the formation of the solder resist layer, providing a plurality of solder balls in the openings of the solder resist layer so that the solder balls are electrically connected to the connection pads of the interconnections.

7. The semiconductor device manufacturing method according to claim 1, further comprising forming a plurality of upper layer interconnections by patterning the upper layer interconnection forming metal foil attached on the sealing medium.

8. The semiconductor device manufacturing method according to claim 7, further comprising forming an overcoat film on upper surfaces of the upper layer interconnections and the sealing medium.

9. The semiconductor device manufacturing method according to claim 1, wherein said at least one projection electrode is cone-shaped.

10. The semiconductor device manufacturing method according to claim 1, wherein the second sealing medium forming sheet is penetrated by the lower vertical conducting part.

11. The semiconductor device manufacturing method according to claim 1, wherein said at least one projection electrode comprises a plurality of projection electrodes formed by the upper vertical conducting parts on the undersurface of the upper layer interconnection forming metal foil.

12. A semiconductor device manufacturing method comprising:

preparing an interconnection forming member which includes an interconnection forming metal foil, a base plate, and a peel layer positioned between the interconnection forming metal foil and the base plate;

forming a plurality of interconnections by patterning the interconnection forming metal foil, each of the interconnections including a connection pad;

electrically connecting a semiconductor component which has a semiconductor substrate and a plurality of electrode terminals provided on an underside of the semiconductor substrate, by mounting the electrode terminals on the interconnections;

forming an under fill medium between the semiconductor substrate and at least a part of the peel layer and interconnections;

covering the semiconductor component, a part of the under fill medium exposed from the semiconductor component, and a part of the interconnections exposed from the under fill medium with a sealing medium;

removing the base plate; and forming a solder resist on undersurfaces of the under fill medium and the sealing medium, the solder resist including a plurality of openings in parts corresponding to the connection pads of the interconnections;

wherein covering the semiconductor component, the part of the under fill medium exposed from the semiconductor component, and the part of the interconnections exposed from the under fill medium with the sealing medium includes:

providing a first sealing medium forming sheet on the interconnections and peel layer, the first sealing medium forming sheet including an opening in which the semiconductor component is held;

providing a second sealing medium forming sheet on the first sealing medium forming sheet, the second sealing medium forming sheet including an opening in which the semiconductor component is held and a lower vertical conducting part;

providing a third sealing medium forming sheet on the second sealing medium forming sheet;

providing an upper layer interconnection forming metal foil on the third sealing medium forming sheet, the upper layer interconnection forming metal foil including upper vertical conducting parts on an undersurface thereof; and heating and pressing the first, second, and third sealing medium forming sheets and the upper layer interconnection forming metal foil from above and below, thereby forming the sealing medium from the first, second, and third sealing medium forming sheets;

wherein at least one of the first sealing medium forming sheet and the third sealing medium forming sheet is penetrated by at least one projection electrode; and wherein said at least one projection electrode projects from a surface of one of the first sealing medium forming sheet and the third sealing medium forming sheet before the heating and pressing, and changes shape in the heating and pressing by contact with the lower vertical conducting part.

13. The semiconductor device manufacturing method according to claim 9, wherein said at least one cone-shaped projection electrode penetrates the third sealing medium forming sheet, an apex of said at least one cone-shaped projection electrode projects from the surface of the third sealing medium forming sheet and faces the lower vertical conducting part before the heating and pressing, and the apex of said at least one cone-shaped projection electrode changes shape in the heating and pressing by contact with the lower vertical conducting part.

14. The semiconductor device manufacturing method according to claim 12, wherein said at least one projection electrode is cone-shaped.

15. The semiconductor device manufacturing method according to claim 14, wherein said at least one cone-shaped projection electrode penetrates the third sealing medium forming sheet, an apex of said at least one cone-shaped projection electrode projects from the surface of the third sealing medium forming sheet and faces the lower vertical conducting part before the heating and pressing, and the apex of said at least one cone-shaped projection electrode changes shape in the heating and pressing by contact with the lower vertical conducting part.

16. The semiconductor device manufacturing method according to claim 12, wherein the second sealing medium forming sheet is penetrated by the lower vertical conducting part.

17. The semiconductor device manufacturing method according to claim 12, wherein said at least one projection electrode comprises a plurality of projection electrodes formed by the upper vertical conducting parts on the undersurface of the upper layer interconnection forming metal foil.

* * * * *